United States Patent
Huang

(10) Patent No.: US 6,559,490 B1
(45) Date of Patent: May 6, 2003

(54) METHOD OF PROCESSING DIELECTRIC LAYER IN FERROELECTRIC RAM AND STRUCTURE OF THE LIKE

(75) Inventor: Chi-Tung Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/065,612

(22) Filed: Nov. 4, 2002

(51) Int. Cl.[7] ................................................ H01L 29/76
(52) U.S. Cl. ............................ 257/295; 438/3; 438/240
(58) Field of Search ................................. 257/295–312; 438/3, 238–256, 381, 390–399

(56) References Cited

U.S. PATENT DOCUMENTS 6,465,826 B2 * 10/2002 Kasai .......................... 257/295
6,495,879 B1 * 12/2002 Kobayashi .................. 257/310

* cited by examiner

Primary Examiner—Jey Tsai
(74) Attorney, Agent, or Firm—Jiang Chyun IP Office

(57) ABSTRACT

A method of processing dielectric layers in FeRAM and the structure of the like are provided. A FeRAM having a barrier layer, a first electrode, a second electrode, and a ferroelectric material is sandwiched between two layers of gradient dielectric layers. These gradient dielectric layers have changing refraction index from one side to the other side. As a result, these gradient dielectric layers prevent hydrogen from damaging the FeRAM structure. The change in refraction index is achieved by adjusting the ratio and deposition power of the $SiH_4$ and $N_2O$ during plasma enhanced chemical vapor deposition of the gradient dielectric layers.

21 Claims, 2 Drawing Sheets

METHOD OF PROCESSING DIELECTRIC LAYER IN FERROELECTRIC RAM AND STRUCTURE OF THE LIKE

BACKGROUND OF INVENTION

1. Field of the Invention

The present invention is generally related to ferroelectric random access memory (FeRAM), and more specifically to method of processing dielectric layer in FeRAM and structure of the like.

2. Description of Related Art

Computer memories are generally categorized into non-volatile and volatile memories. Volatile memories such as DRAMs and SRAMs are usually much faster and more robust but they suffer from the ability to retain information when power is removed. On the other hand, non-volatile such as EEPROM and flash RAM are retain data when power is removed but they are usually slower and have a limited life span.

In the recent years, with the advance of the film formation technique, researches have been extensively made on non-volatile semiconductor memories using ferroelectric thin films. This nonvolatile semiconductor memory allows high speed rewriting by making use of high-speed polarization reversal and its residual polarization of a ferroelectric thin film. This nonvolatile semiconductor memories including ferroelectric thin films, which are being studied at present, are classified into a type of memory by detecting the amount of electric charges stored in a ferroelectric capacitor portion and a type of detecting a change in resistance of a semiconductor due to spontaneous polarization of a ferroelectric material. The semiconductor memory cell, to which the present invention is applied, is the former type.

Despite the superior performance and virtually unlimited read/write ability of FeRAM, the fabrication method of FeRAM is still not mature enough for mass production. The process of fabricating FeRAM generally includes various heat-treatment steps performed at a hydrogen gas atmosphere at temperatures in a range of 280.degree. to 450.degree. C. In such a heat-treatment, hydrogen gas may permeate an upper electrode. Furthermore hydrogen from the neighboring layers will also serve to damage the FeRAM structure. The penetration of hydrogen greatly affects the performance and durability of the FeRAM. As a result, a method and structure that can effectively block hydrogen at a low cost would be beneficial.

SUMMARY OF INVENTION

The present invention provides a ferroelectric structure of a FeRAM that can effectively prevent the penetration of hydrogen by using gradient dielectric layers. A ferroelectric capacitor comprising a first electrode, a second electrode, and a ferroelectric material is protected by two gradient dielectric layers on the top and the bottom. The first electrode and the first gradient dielectric layer are separated by a barrier layer. The gradient dielectric layers have a changing refraction index from their bottom side to their top side. The first dielectric layer which is located below the ferroelectric capacitor has an increasing refraction index from the bottom side to the top side, whereas the second dielectric layer which is located over the ferroelectric capacitor and covering the entire FeRAM has a decreasing refraction index from the bottom side to the top side.

The material of the first and second gradient dielectric layer is SiO2. These layers are deposited by plasma enhanced chemical vapor deposition. The refraction index is changed by adjusting the ratio and deposition power of the SiH4 and N2O mixture during the deposition. The result is a linear gradient refraction index from one side to the other side of the first and second dielectric layer. These gradient dielectric layers can effectively prevent hydrogen from damaging the FeRAM.

It is to be understood that both the foregoing general description and the following detailed description are exemplary, and are intended to provide further explanation of the invention is claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2A–2D are sequential diagrams showing the formation of the FeRAM structure according to another preferred embodiment of the present invention.

DETAILED DESCRIPTION

Figure 1A:
FIGS. 1A–1D are sequential diagrams showing the formation of the FeRAM structure according to the preferred embodiment of the present invention.
Figure 1B:
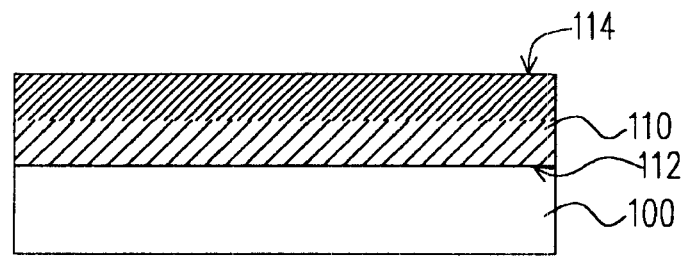

FIG. 1A to FIG. 1D is a series of schematic diagrams showing the formation of the FeRAM structure according to the preferred embodiment of the present invention. Please refer to FIG. 1A, an oxide layer 100 is formed as the base of the ferroelectric structure. The oxide layer 100 can be any common dielectric material formed by sputtering. In FIG. 1B, a first gradient dielectric layer 110 is then deposited before the formation of the ferroelectric material as protection. The first gradient electric layer 110 is SiO2 formed by plasma enhanced chemical vapor deposition (PECVD) using TEOS.

SiO2 layers formed by PECVD consist mostly of hydrogen and nitrogen. As a result, the hydrogen from neighboring layers can easily penetrate conventional barrier layers causing degradation of the ferroelectric material or corrosion of the electrodes. Since the amount of hydrogen is directly related to the reaction temperature, RF power, and the ratio of N2O and SiH4, the present invention provides a method of forming a special gradient dielectric layer by adjusting the parameters of the PECVD process to prevent the penetration of hydrogen into the structure during and after the fabrication process.

The present invention realizes an unexpected result through experiment by adjusting the ratio and deposition power of the SiH4 and N2O of a SiO2 layer deposited by PECVD. As a result of that adjustment, the refraction index of the gradient dielectric layer is changed. The refraction index of a conventional oxide layer is approximately 1.46. The gradient dielectric layers possess unique characteristics of a changing refraction index from one surface to another of the gradient dielectric layers. The refraction index of the bottom surface 112 of the first gradient dielectric layer 110 is 1.46 at the beginning of the deposition and gradually increase to 1.66 of the top surface 114. The change in refraction index is achieved by adjusting the ratio and deposition power of the SiH4 and N2O while maintaining other parameters constant. The refraction index of 1.66 is the refraction index of a material called hydrogen blocking oxide (self-named) which is proven to provide the blockage of hydrogen. The SiH4 and N2O ratio are gradually adjusted so the change of the refraction index of the gradient dielectric layers is approximately linear. The density of the first dielectric layer with a refraction index of 1.66 can effectively block the penetration of hydrogen. The gradient dielectric layers can effectively prevent damage to the FeRAM from hydrogen without sacrificing performance.

Figure 1C:
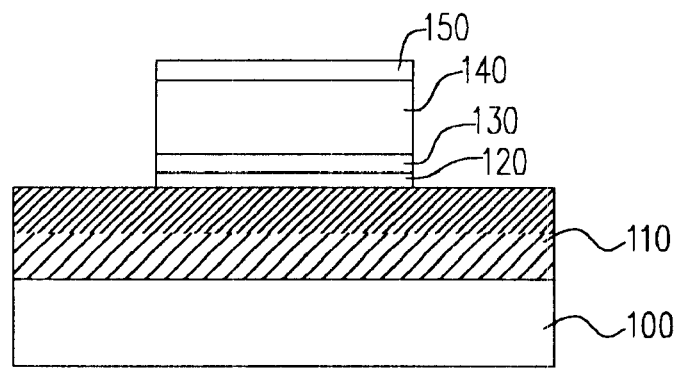

In FIG. 1C, after forming the first gradient dielectric layer 110, a barrier layer 120 for the ferroelectric capacitor is deposited. The barrier layer 120 can be any made of any insulating material which acts as a barrier between the electrodes and the gradient dielectric layer. A ferroelectric capacitor comprising of a bottom electrode 130, a layer of ferroelectric material 140, and an upper electrode 150 is formed on the barrier layer 120. The deposition and forming of the ferroelectric capacitor are already well-known in the skilled of the art and will not be described in details. After formation of the ferroelectric capacitor, a second gradient dielectric layer 160 is formed to protect the ferroelectric capacitor from the attack of hydrogen.

Figure 1D:
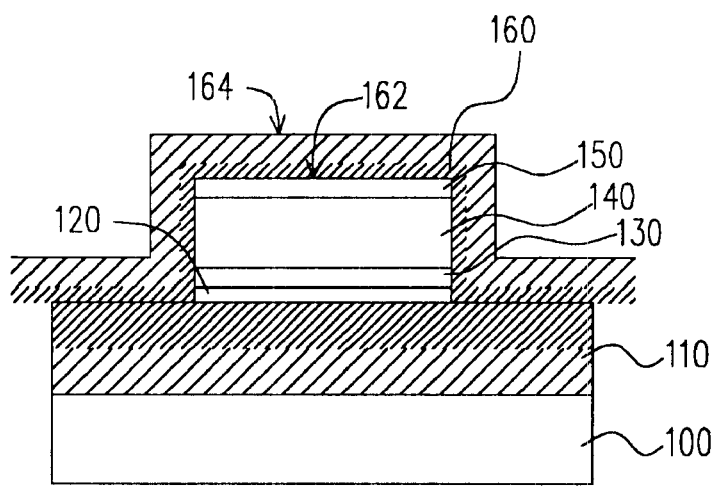

In FIG. 1D, the formation of the second gradient dielectric layer 160 is similar to that of the first gradient dielectric layer 110 but the gradient of the refraction index is opposite. The second dielectric layer 160 is a SiO2 layer deposited by PECVD. The bottom side 162 of the second gradient dielectric layer 160 conforms along the landscape of the structure and is contact with the top side 112 of the first gradient dielectric layer 110, the upper electrode 150, and the sides of the ferroelectric capacitor. The second dielectric layer 160 has two opposing sides, which are bottom side 162 and top side 164. The refraction index of the bottom side 162 is 1.66 and the top side 164 is 1.46. The change in the refraction index from the bottom side to the top side is approximately linear. The gradient change in refraction index is achieved by adjusting the ratio and deposition power of the SiH4 and N2O while maintaining other parameters constant. The refraction index of 1.66 is the refraction index of a material called hydrogen blocking oxide (self-named) which is proven to provide the blockage of hydrogen. The SiH4 and N2O ratio are gradually adjusted so the change of the refraction index of the gradient dielectric layers is approximately linear. This special gradient characteristic of the dielectric layer is the key to blocking hydrogen from attacking the FeRAM causing degradation in performance and decrease in life span.

Figure 2A:
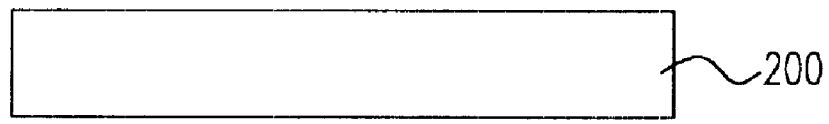
Figure 2B:
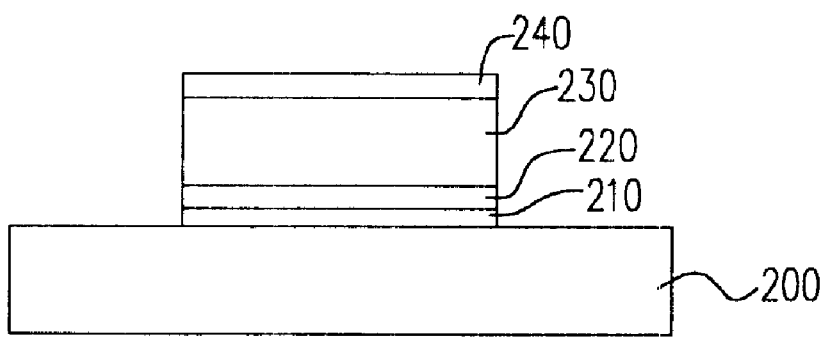

The second embodiment differs from the first embodiment by omitting the first gradient dielectric layer. The existence of the top gradient dielectric layer covering the entire ferroelectric structure is the most important for protecting hydrogen attack during the fabrication of FeRAM. In FIG. 2A, an oxide layer base 200 is provided. Afterwards, a barrier layer 120 for the ferroelectric capacitor is deposited. The barrier layer 120 can be any made of any insulating material such as TiN which acts as a barrier between the electrodes and the gradient dielectric layer. In FIG. 2B, a ferroelectric capacitor comprising of a bottom electrode 220, a layer of ferroelectric material 230, and an upper electrode 240 is formed on the barrier layer 210. The deposition and forming of the ferroelectric capacitor are already well-known in the skilled of the art and will not be described in details. After formation of the ferroelectric capacitor, a gradient dielectric layer 250 is formed to protect the ferroelectric capacitor from the attack of hydrogen.

Figure 2C:
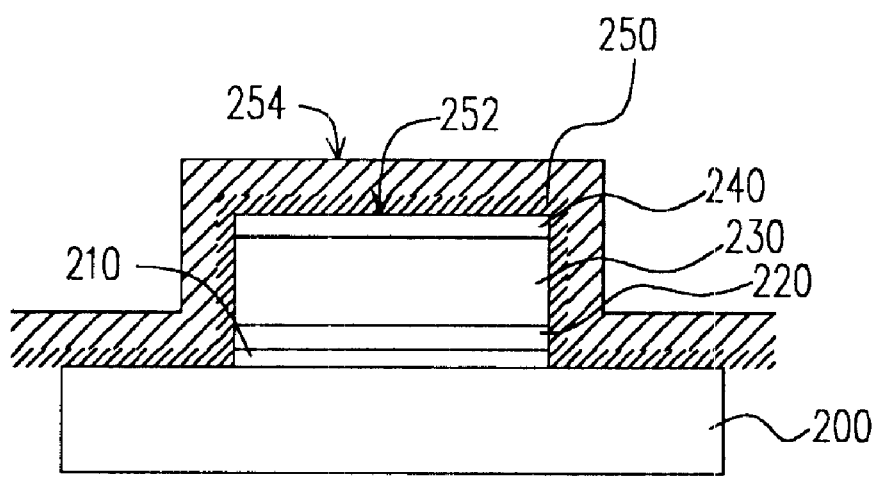

In FIG. 2C, the dielectric layer 250 is a SiO2 layer deposited by PECVN. The bottom side 252 of the gradient dielectric layer 250 conforms along the landscape of the structure and is contact with the oxide layer 200, the upper electrode 150, and the sides of the ferroelectric capacitor. The dielectric layer 250 has two opposing sides which are bottom side 252 and top side 254. The refraction index of the bottom side 252 is 1.66 and the top side 252 is 1.46. The change in the refraction index from the bottom side to the top side is approximately linear. The gradient change in refraction index is achieved by adjusting the ratio and deposition power of the SiH4 and N2O while maintaining other parameters constant. The refraction index of 1.66 is the refraction index of a material called hydrogen blocking oxide (self-named) which is to provide the blockage of hydrogen. The SiH4 and N2O ratio are gradually adjusted so the change of the refraction index of the gradient dielectric layers is approximately linear. This special gradient characteristic of the dielectric layer is the key to blocking hydrogen from attacking the FeRAM causing degradation in performance and decrease in life span.

It will be apparent to those skilled in the art that various modifications and variations can be made to the structure and method of the present invention without departing from the scope or spirit of the present invention. In view of the foregoing: description, it is intended that the present invention covers modifications and variations of this invention provided they fall within the scope of the following claims and their equivalents.

What is claimed is:

1. A FeRAM structure, comprising:
   a first electrode;
   a second electrode located above the first electrode;
   a ferroelectric material located between the first and second electrodes;
   a barrier layer located beneath the first electrode;
   a first gradient dielectric layer with a bottom side and a top side, where the refraction index changes from the bottom side to the top side, located beneath the barrier layer;
   a second gradient dielectric layer with a bottom side and a top side, where the refraction index changes from the bottom side to the top side, covering the whole FeRAM structure.

2. The FeRAM structure in claim 1, wherein the bottom side of the first gradient dielectric layer and the top side of the second gradient dielectric layer have a refraction index of 1.46.

3. The FeRAM structure in claim 1, wherein the top side of the first gradient dielectric layer and the bottom side of the second gradient dielectric layer have a refraction index of 1.66.

4. The FeRAM structure in claim 1, wherein the refraction index of the first gradient dielectric layer and the second gradient dielectric layer change in an approximately linear manner from the bottom face to the top face.

5. A FeRAM structure, comprising:
   a first electrode;
   a second electrode located above the first electrode;
   a ferroelectric material located between the first and second electrodes;
   a barrier layer located beneath the first electrode;
   a first gradient dielectric layer with a bottom side and a top side, where the refraction index increases from the bottom side to the top side, located beneath the barrier layer;
   a second gradient dielectric layer with a bottom side and a top side, where the refraction index decreases from the bottom side to the top side, covering the whole FeRAM structure.

6. The FeRAM structure in claim 5, wherein the bottom side of the first gradient dielectric layer and the top side of the second gradient dielectric layer have a refraction index of 1.46.

7. The FeRAM structure in claim 5, wherein the top side of the first gradient dielectric layer and the bottom side of the second gradient dielectric layer have a refraction index of 1.66.

8. The FeRAM structure in claim 5, wherein the refraction index of the first gradient dielectric layer and the second gradient dielectric layer increases and decreases respectively in an approximately linear manner from the bottom face to the top face.

9. A FeRAM structure, comprising:
   a first electrode;
   a second electrode located above the first electrode;
   a ferroelectric material located between the first and second electrodes;
   a barrier layer located beneath the first electrode;
   a gradient dielectric layer with a bottom side and a top side, where the refraction index changes from the bottom side to the top side, covering the whole FeRAM structure.

10. The FeRAM structure in claim 9, wherein the bottom side of the gradient dielectric layer has a refraction index of 1.66.

11. The FeRAM structure in claim 9, wherein the top side of the gradient dielectric layer has a refraction index of 1.46.

12. The FeRAM structure in claim 9, wherein the refraction index of the gradient dielectric layer changes respectively in an approximately linear manner from the bottom face to the top face.

13. A FeRAM structure, comprising:
   a first electrode;
   a second electrode located above the first electrode;
   a ferroelectric material located between the first and second electrodes;
   a barrier layer located beneath the first electrode;
   a gradient dielectric layer with a bottom side and a top side, where the refraction index decreases from the bottom side to the top side, covering the whole FeRAM structure.

14. The FeRAM structure in claim 13, wherein the bottom side of the gradient dielectric layer has a refraction index of 1.66.

15. The FeRAM structure in claim 13, wherein the top side of the gradient dielectric layer has a refraction index of 1.46.

16. The FeRAM structure in claim 13, wherein the refraction index of the gradient dielectric layer decreases respectively in an approximately linear manner from the bottom face to the top face.

17. A method for fabricating a FeRAM comprising a ferroelectric capacitor with a barrier layer, a first electrode, a second electrode, and a ferroelectric material, the method comprising:
   forming a first gradient dielectric layer with a bottom side and a top side, where a refraction index changes from the bottom side to the top side, before the formation of the ferroelectric capacitor;
   forming a second gradient dielectric layer with a bottom side and a top side, where a refraction index changes from the bottom side to the top side, after the formation of the ferroelectric capacitor.

18. The method of claim 17, when forming the first gradient dielectric layer and the second gradient dielectric layer, a ratio and a deposition power of $SiH_4$ and $N_2O$ are adjusted to change the refraction index.

19. The method of claim 17, wherein the refraction index of the first gradient dielectric layer increases from the bottom side to the top side.

20. The method of claim 17, wherein the refraction index of the second gradient dielectric layer decreases from the bottom side to the top side.

21. A method for fabricating a FeRAM, comprising:
   forming a first gradient dielectric layer with a bottom side and a top side, where a refraction index increases from the bottom side to the top side;
   forming a barrier layer on top of the first gradient dielectric layer;
   forming first electrode on the barrier layer;
   forming a ferroelectric material on the first electrode;
   forming a second electrode on the ferroelectric material;
   forming a second gradient dielectric layer with a bottom side and a top side, where a refraction index decreases from the bottom side to the top side, on top of the first gradient dielectric layer and the second electrode.

* * * * *